United States Patent
Kwon et al.

(10) Patent No.: US 7,276,415 B2
(45) Date of Patent: Oct. 2, 2007

(54) CONTACTLESS NONVOLATILE MEMORY DEVICE AND METHOD OF FORMING THE SAME

(75) Inventors: Wook-Hyun Kwon, Yongin-si (KR); Chan-Kwang Park, Seoul (KR); Sang-Pil Sim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/590,620

(22) Filed: Oct. 31, 2006

(65) Prior Publication Data

US 2007/0105309 A1    May 10, 2007

(30) Foreign Application Priority Data

Nov. 9, 2005    (KR) .................. 10-2005-0106902

(51) Int. Cl.
*H01L 21/8247* (2006.01)
(52) U.S. Cl. ................ 438/259; 438/589; 257/E21.179
(58) Field of Classification Search ........ 438/257–267, 438/589; 257/E21.179
See application file for complete search history.

(56) References Cited

U.S. PATENT DOCUMENTS 4,939,100 A * 7/1990 Jeuch et al. ................ 438/297
6,057,574 A   5/2000 Hisamune ................... 257/315

FOREIGN PATENT DOCUMENTS

| JP | 10-107230 | 4/1998 |
| KR | 1998-0012568 | 4/1998 |
| KR | 10-0239701 B1 | 10/1999 |
| KR | 10-0308591 | 8/2001 |

* cited by examiner

*Primary Examiner*—Richard A. Booth
(74) *Attorney, Agent, or Firm*—F. Chau & Associates, LLC

(57) ABSTRACT

A method of forming a contactless nonvolatile memory device includes preparing a semiconductor substrate including a cell array region, forming a plurality of mask patterns being parallel to each other on the semiconductor substrate in the cell array region, etching the semiconductor substrate using the mask patterns as an etch mask to form a plurality of recess regions, forming a gate insulating layer on sidewalls and bottoms of the recess regions, forming a floating gate layer on an upper surface of the semiconductor substrate to fill the recess regions, planarizing the floating gate layer to expose upper surfaces of the mask patterns and to form floating gate patterns in the recess regions, forming buried impurity diffusion regions in the semiconductor substrate under the mask patterns, forming an intergate dielectric layer, forming a control gate layer, and patterning the control gate layer, the intergate dielectric layer and the floating gate pattern to form a plurality of parallel word lines crossing the mask patterns, floating gates between the word lines and the recess regions, and an intergate dielectric pattern between the floating gates and the word lines, and to expose the recess regions and the mask patterns between word lines.

7 Claims, 11 Drawing Sheets

CONTACTLESS NONVOLATILE MEMORY DEVICE AND METHOD OF FORMING THE SAME

CROSS-REFERENCE TO RELATED APPLICATION

This application claims priority to Korean Patent Application No. 2005-106902 filed on Nov. 9, 2005, the disclosure of which is incorporated by reference in its entirety herein.

BACKGROUND OF THE INVENTION

1. Technical Field

The present disclosure relates to a semiconductor device and a method of forming the same, and more particularly, to a contactless nonvolatile memory device and a method of forming the same.

2. Discussion of the Related Art

A NOR type contactless nonvolatile memory device having a virtual ground array structure includes a buried impurity diffusion region, which is formed in a semiconductor substrate and crosses word lines at right angles. The buried impurity diffusion region can be a source or a drain depending on which cell is programmed or read. A cell size can be reduced when the contact plug is not formed in every unit cell. For example, a contact plug can be formed only in the buried impurity diffusion region in both ends of a cell array.

In a cell of the virtual ground array structure, the buried impurity diffusion region is isolated from another buried impurity diffusion region by having an impurity region of an opposite conductivity therebetween. Therefore, a distance between two diffusion regions should be long enough to prevent a punch through, which can be generated between the two impurity diffusion regions.

Also, a misalignment may be caused by a decreased process margin in patterning a floating gate layer.

SUMMARY OF THE INVENTION

Exemplary embodiments of the present invention provide a highly integrated contactless nonvolatile memory device which can reduce, for example, a punch through, a leakage current, and a misalignment.

In an exemplary embodiment of the present invention, recess regions are formed between two buried impurity diffusion regions in a semiconductor substrate, and then a portion of the recess regions is filled with an interlayer insulating layer. Accordingly, although a semiconductor device is highly integrated, a distance between the two buried impurity diffusion regions substantially becomes longer by the recess regions, thereby preventing, for example, a punch through or a leakage current. In an exemplary embodiment of the present invention, floating gates are self-aligned to adjacent mask patterns, thereby preventing a misalignment and improving a process margin.

According to an embodiment of the present invention, a method of forming contactless nonvolatile memory devices includes preparing a semiconductor substrate including a cell array region, forming a plurality of parallel mask patterns crossing the semiconductor substrate in the cell array region, etching the semiconductor substrate using the mask patterns as an etch mask to form a plurality of recess regions, forming a gate insulating layer conformally on sidewalls and bottoms of the recess regions, forming a floating gate layer on an upper surface of the resultant semiconductor substrate to fill the recess regions, planarizing the floating gate layer to expose upper surfaces of the mask patterns and forming floating gate patterns in the recess regions simultaneously, forming buried impurity diffusion regions under the mask patterns on the semiconductor substrate, forming an intergate dielectric layer conformally, forming a control gate layer, and patterning the control gate layer, the intergate dielectric layer, and the floating gate pattern to form a plurality of parallel word lines crossing the mask patterns, floating gates located between the word lines and the recess regions, and an intergate dielectric pattern between the floating gates and the word lines, and to expose the recess regions and the mask patterns between word lines.

The method may further include removing a portion of at least both sidewalls of the mask patterns to expose a portion of the semiconductor substrate over the recess regions, after the forming of the recess regions. The gate insulating layer may be formed on the exposed semiconductor substrate, and the floating gate pattern may fill the recess regions and contact the exposed semiconductor substrate interposing the gate insulating layer.

The method may further include removing a portion of an upper portion of the mask patterns such that upper surfaces of the mask patterns are lower than upper surfaces of the floating gate patterns, after the forming of the floating gate patterns.

The mask patterns may be formed of a material having an etch selectivity with respect to the gate insulating layer, the semiconductor substrate and the floating gate patterns, and may be preferably formed of a silicon nitride layer.

The semiconductor substrate may be doped with first conductivity type impurities, and the buried impurity diffusion regions may be doped with second conductivity type impurities.

After the forming of the word lines, the method may further include forming an interlayer insulating layer on an entire upper surface of the resultant semiconductor substrate to fill the recess regions exposed between the word lines; and forming bit lines overlapping the buried impurity diffusion regions on the interlayer insulating layer.

In an exemplary embodiment of the present invention, a contactless nonvolatile memory device includes a semiconductor substrate including recess regions formed in the form of parallel lines, buried impurity diffusion regions formed between the recess regions on the semiconductor substrate, mask patterns in the form of lines located on the buried impurity diffusion regions and parallel to the recess regions, a gate insulating layer conformally formed on sidewalls and bottoms of the recess regions, a plurality of parallel word lines formed on the semiconductor substrate and crossing the recess regions, floating gates interposed between the word lines and the gate insulating layer, and filling the recess regions and having sidewalls aligned to sidewalls of the mask patterns, and an intergate dielectric pattern interposed between the floating gates and the word lines.

BRIEF DESCRIPTION OF THE DRAWINGS

Exemplary embodiments of the present invention can be understood in detail from the following description taken in conjunction with the accompanying drawings of which.

DESCRIPTION OF EXEMPLARY EMBODIMENTS

Exemplary embodiments of the present invention will be described in detail with reference to the accompanying drawings. The present invention may, however, be embodied in many different forms and should not be construed as limited to the embodiments set forth herein.

FIGS. 1A, 2A, 3A, 4A, 5A, 6A, 7A, 8A, 9A and 10A are plan views for illustrating a method of forming a nonvolatile memory device according to an exemplary embodiment of the present invention. FIGS. 1B, 2B, 3B, 4B, 5B, 6B, 7B, 8B, 9B and 10B are cross-sectional views taken along the line I-I' of FIGS. 1A, 2A, 3A, 4A, 5A, 6A, 7A, 8A, 9A and 10A, respectively. FIGS. 1C, 2C, 3C, 4C, 5C, 6C, 7C, 8C, 9C and 10C are cross-sectional views taken along the line II-II' of FIGS. 1A, 2A, 3A, 4A, 5A, 6A, 7A, 8A, 9A and 10A, respectively. FIG. 10D is a cross-sectional view taken along the line III-III' of FIG. 10A.

Figure 1A:
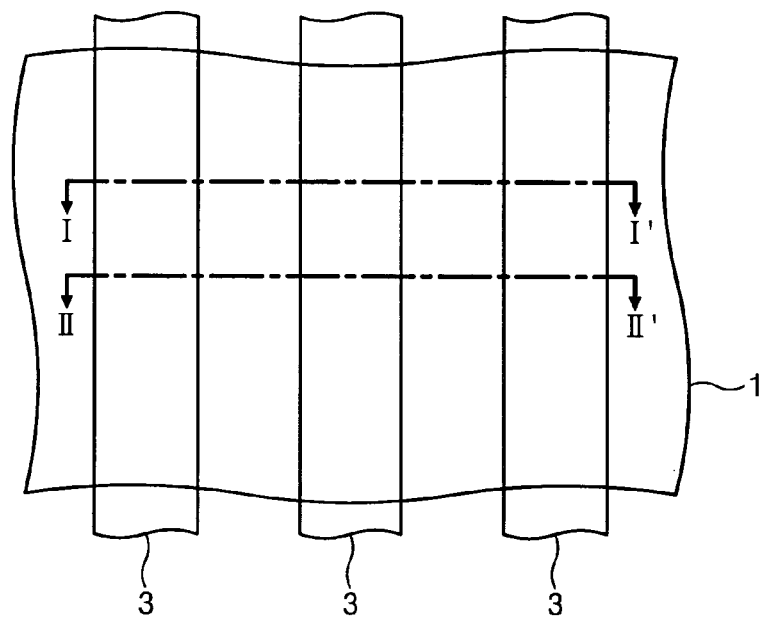
FIGS. 1A, 2A, 3A, 4A, 5A, 6A, 7A, 8A, 9A and 10A are plan views for illustrating a method of forming a nonvolatile memory device according to an exemplary embodiment of the present invention.
Figure 1B:
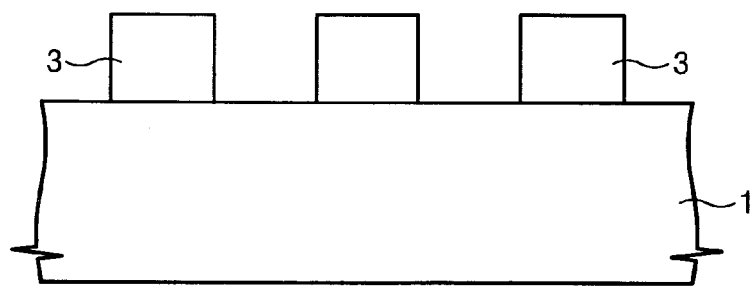
FIGS. 1B, 2B, 3B, 4B, 5B, 6B, 7B, 8B, 9B and 10B are cross-sectional views taken along the line I-I' of FIGS. 1A, 2A, 3A, 4A, 5A, 6A, 7A, 8A, 9A and 10A, respectively.
Figure 1C:
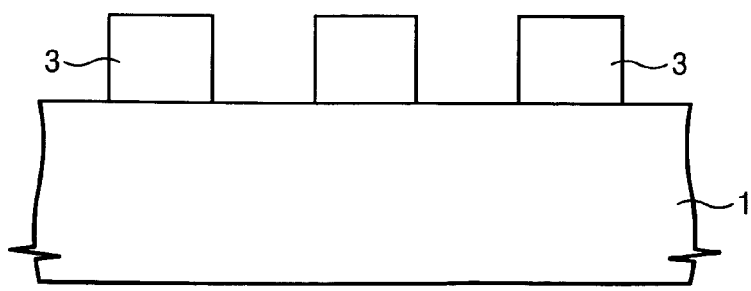
FIGS. 1C, 2C, 3C, 4C, 5C, 6C, 7C, 8C, 9C and 10C are cross-sectional views taken along the line II-II' of FIGS. 1A, 2A, 3A, 4A, 5A, 6A, 7A, 8A, 9A and 10A, respectively.

Referring to FIGS. 1A, 1B, and 1C, mask patterns 3 are formed in a first direction on a semiconductor substrate 1. The semiconductor substrate 1 may be, for example, a single crystalline silicon substrate doped with P-type impurities. The mask patterns 3 may comprise, for example, a silicon nitride layer. The mask patterns 3 can be formed in the form of a plurality of parallel lines according to an exemplary embodiment of the present invention.

Figure 2A:
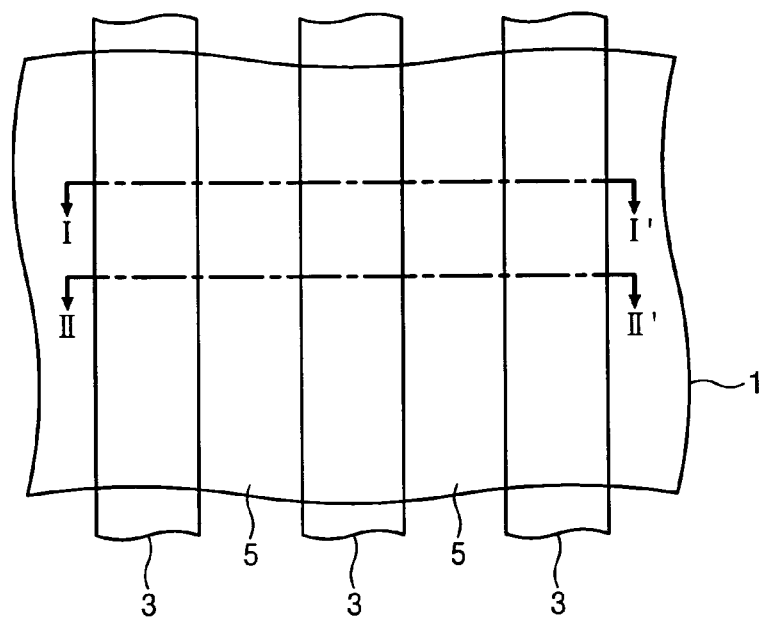
Figure 2B:
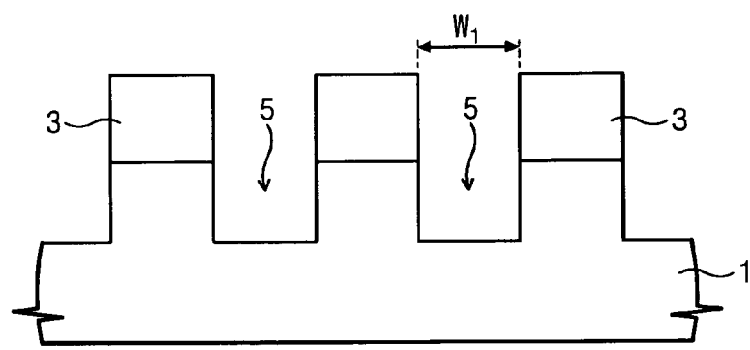
Figure 2C:
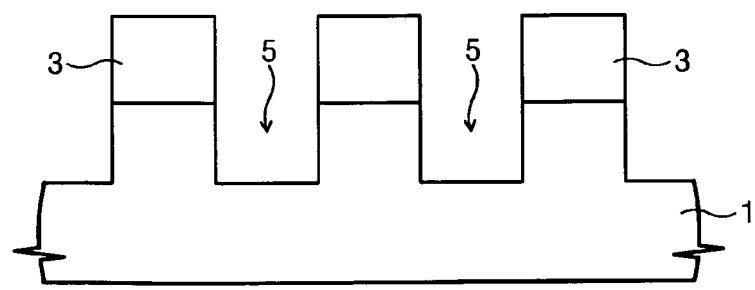

Referring to FIGS. 2A, 2B, and 2C, the semiconductor substrate 1 is patterned using the mask patterns 3 as an etch mask to forming recess regions 5 having a first width W1 in the form of a plurality of lines.

Figure 3A:
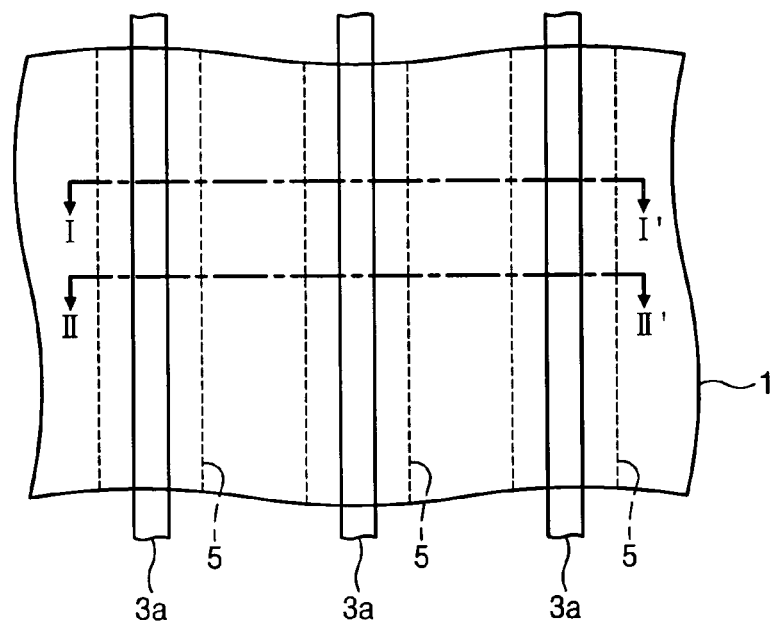
Figure 3B:
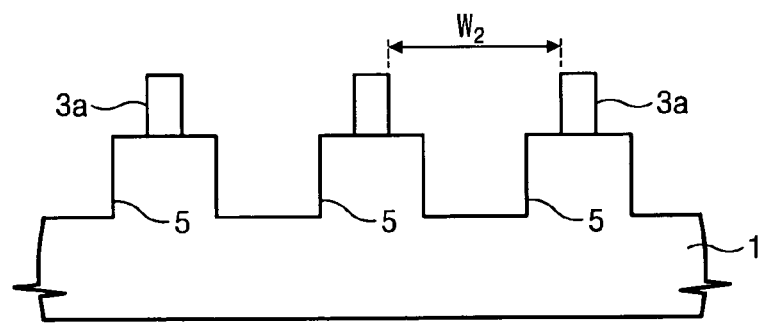
Figure 3C:
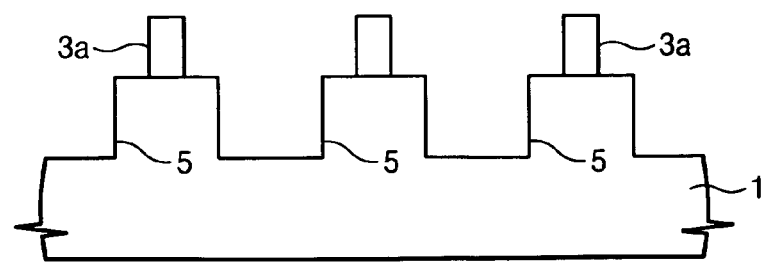

Referring to FIGS. 3A, 3B, and 3C, upper surfaces and a portion of sidewalls of the mask patterns 3 are removed using, for example, phosphoric acid as an etching solution. Then, an upper surface of the semiconductor substrate 1 between the recess regions 5 is partially exposed. Each interval between the mask patterns 3a is a second width W2. After a portion of the sidewalls of the mask patterns 3 is removed, an ion implantation process for the formation of a channel can be performed to the semiconductor substrate 1 using the mask patterns 3a as an ion implantation mask.

Figure 4A:
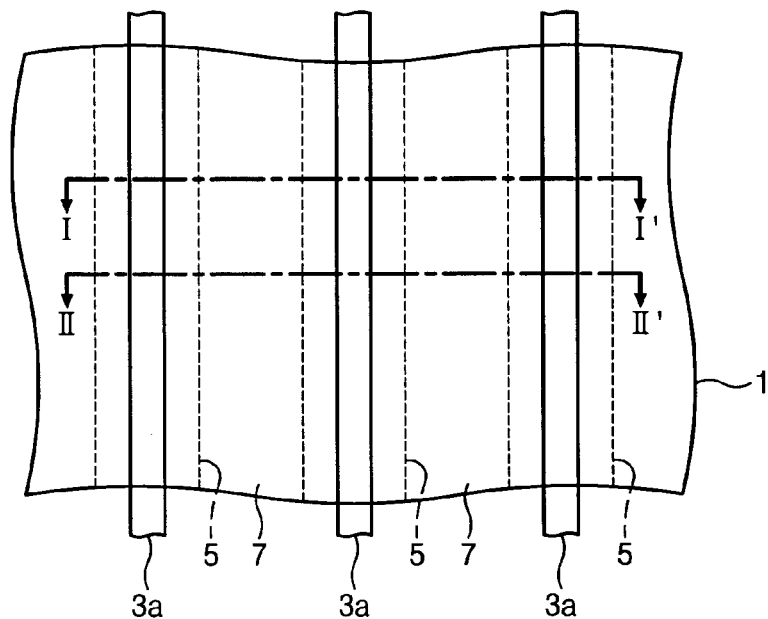
Figure 4B:
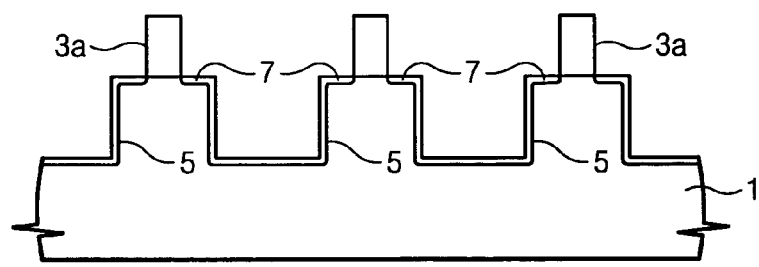
Figure 4C:
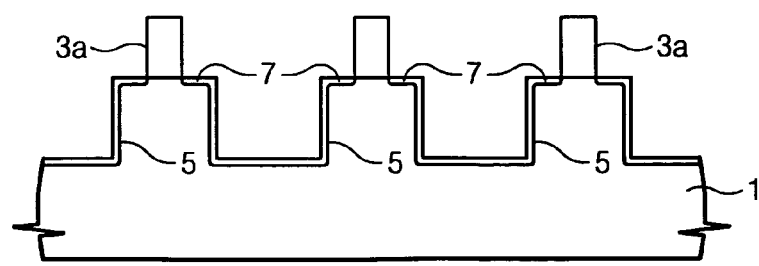

Referring to FIGS. 4A, 4B, and 4C, a gate insulating layer 7 is formed on the semiconductor substrate 1 using, for example, a thermal oxidation process according to an exemplary embodiment of the present invention. The gate insulating layer 7 is conformally formed on sidewalls and bottoms of the recess regions 5 and the partially exposed upper surface of the semiconductor substrate 1 between the recess regions 5.

Figure 5A:
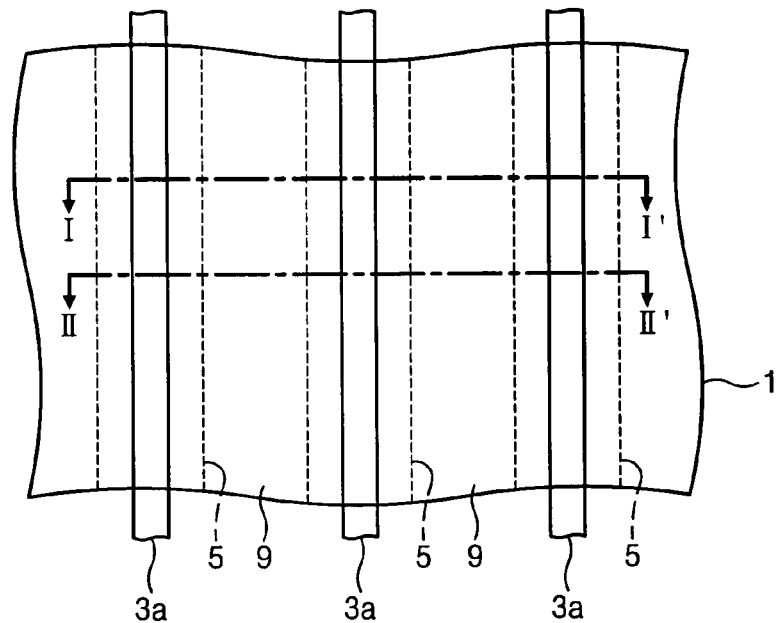
Figure 5B:
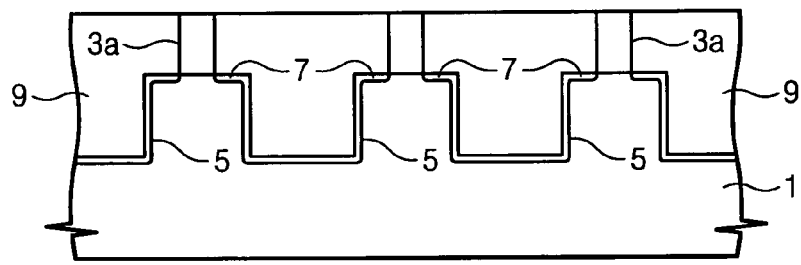
Figure 5C:
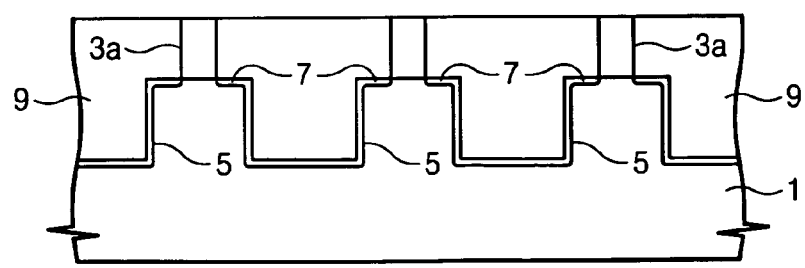

Referring to FIGS. 5A, 5B, and 5C, a floating gate layer (not shown) is formed on an upper surface of the semiconductor substrate 1 to fill the recess regions 5. A planarization process is performed on the floating gate layer to expose upper portions of the mask patterns 3a and to form floating gate patterns 9 between the mask patterns 3a. According to an exemplary embodiment of the present invention, the floating gate pattern 9 has a "T" shape. The floating gate patterns 9 may comprise, for example, doped polysilicon or undoped polysilicon. The planarization process may be a chemical mechanical polishing (CMP) process or an etchback process. The floating gate patterns 9 are self-aligned to the mask patterns 3a, thereby preventing a misalignment and obtaining a process margin.

Figure 6A:
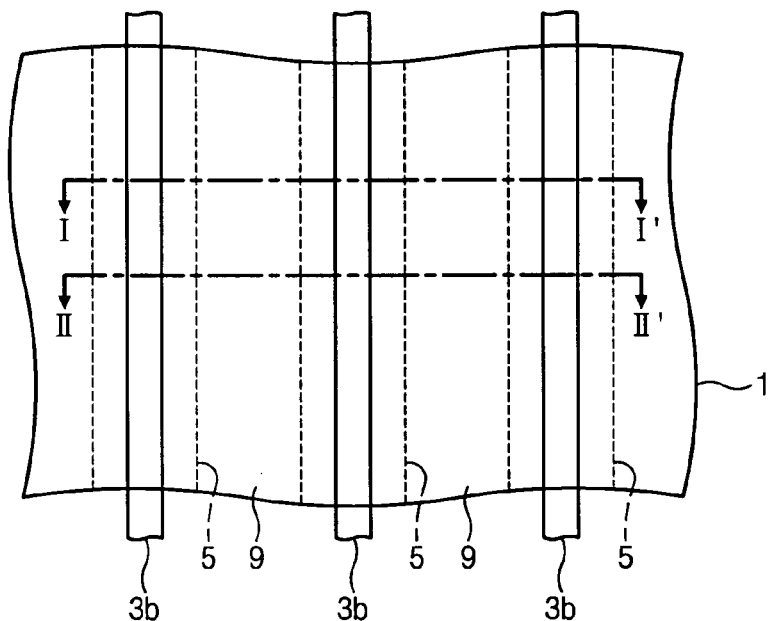
Figure 6B:
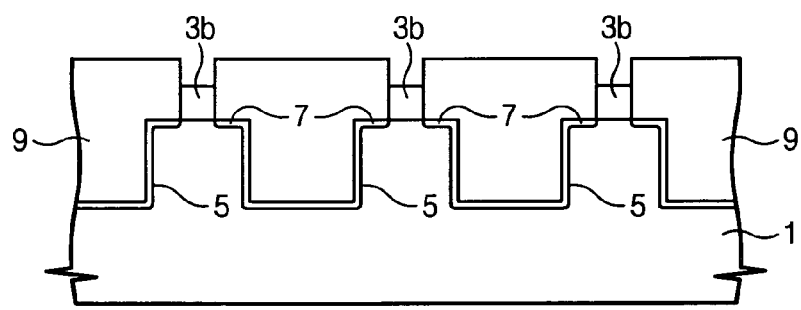
Figure 6C:
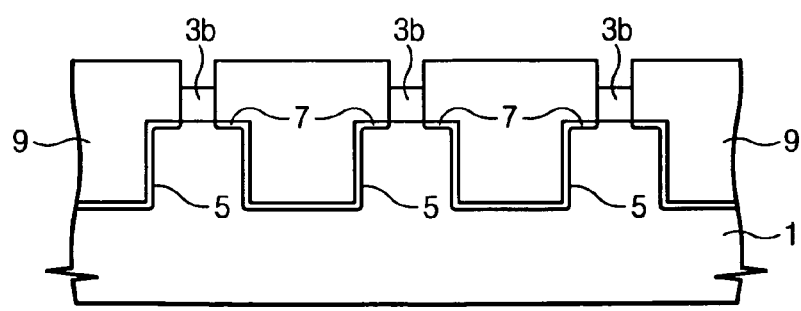

Referring to FIGS. 6A, 6B, and 6C, the upper portions of the exposed mask patterns 3a are partially removed to partially expose sidewalls of the floating gate patterns 9 and to form mask patterns 3b. The upper portions of the mask patterns 3a may be removed, for example, through a wet or a dry etching process. Mask patterns 3b are formed to have an enough height to isolate a buried impurity diffusion region from a word line.

Figure 7A:
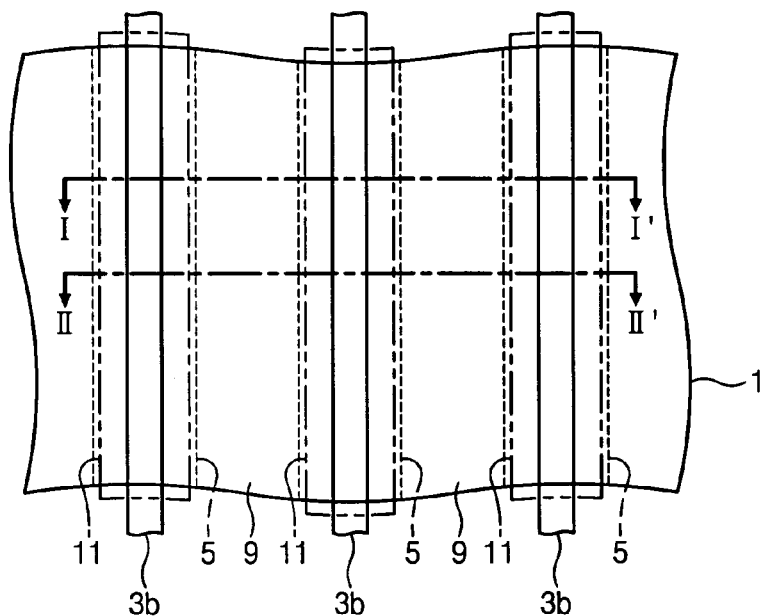
Figure 7B:
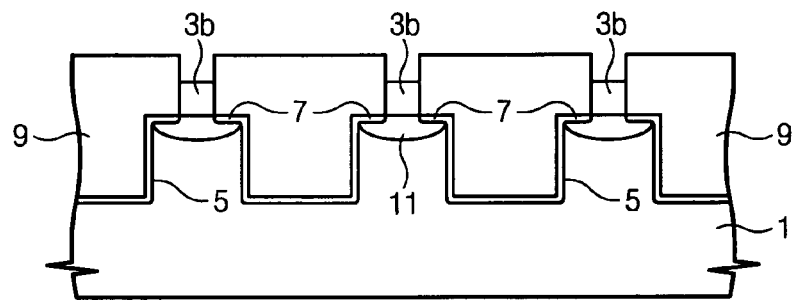
Figure 7C:
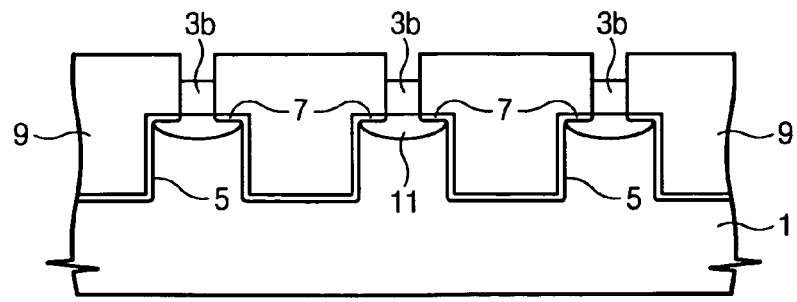

Referring to FIGS. 7A, 7B, and 7C, impurities are implanted into the semiconductor substrate 1 under the mask patterns 3b using the floating gate patterns 9 as an ion implantation mask. Then a heat treatment process is performed to form buried impurity diffusion regions 11. Impurity implantation energy is large enough for the impurities to penetrate through the mask patterns 3b and to reach the semiconductor substrate 1. The impurities doped into the buried impurity diffusion regions 11 can be N-type impurities.

Figure 8A:
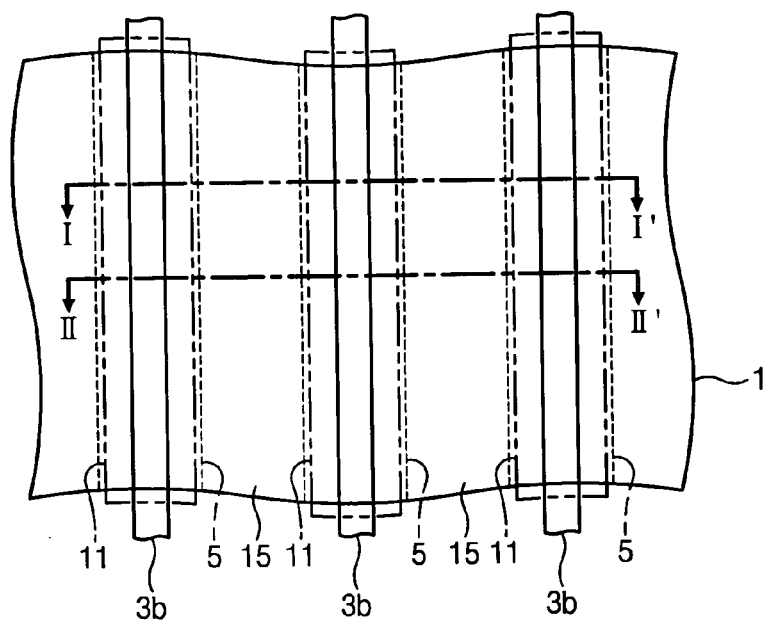
Figure 8B:
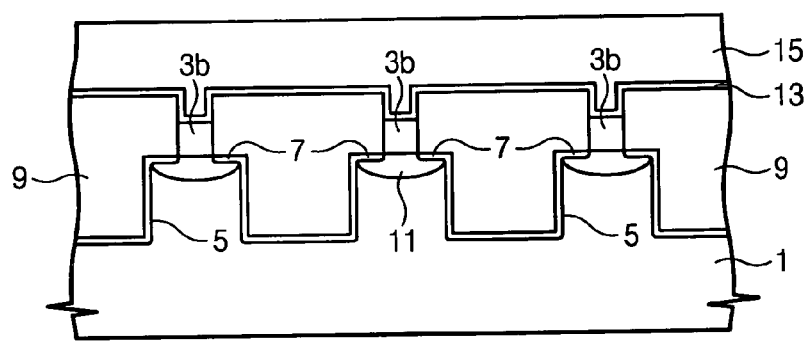
Figure 8C:
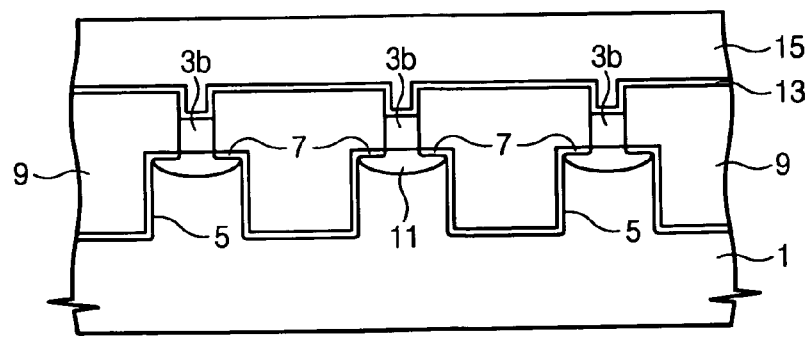

Referring to FIGS. 8A, 8B, and 8C, an intergate dielectric layer 13 is conformally formed on an upper surface of the semiconductor substrate 1. The intergate dielectric layer 13 may comprise, for example, an oxide-nitride-oxide layer. A control gate layer 15 is formed on the intergate dielectric layer 13. The control gate layer 15 may comprise at least one of doped polysilicon, tungsten silicide, tungsten nitride, and tungsten.

Figure 9A:
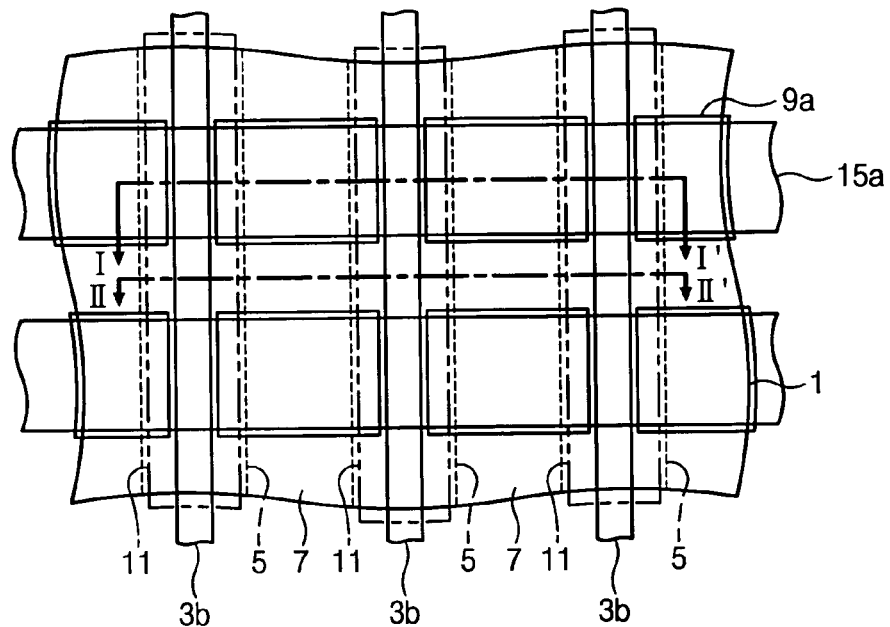
Figure 9B:
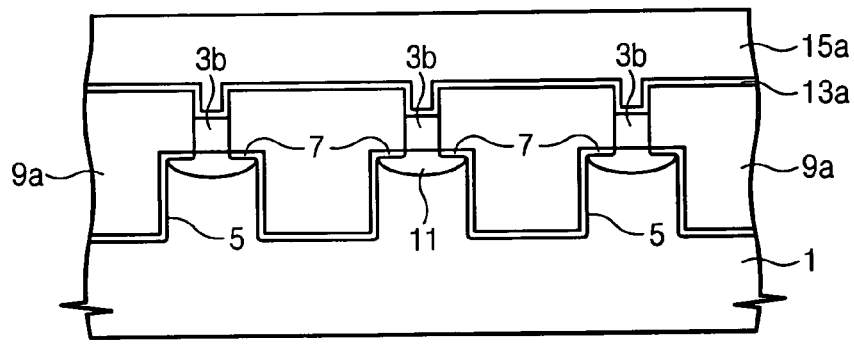
Figure 9C:
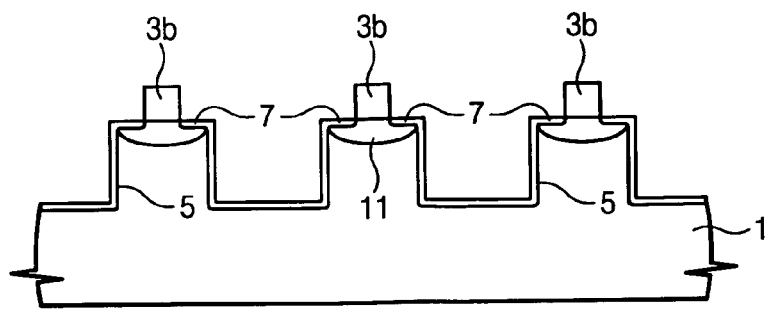

Referring to FIGS. 9A, 9B, and 9C, the control gate layer 15, the intergate dielectric layer 13, and the floating gate patterns 9 are sequentially patterned in a second direction crossing the recess regions 5. A plurality of parallel word lines 15a crossing the recess regions 5 are formed. Floating gates 9a are formed between the word lines 15a and the recess regions 5. An intergate dielectric pattern 13a is formed between the floating gates 9a and the word lines 15a. The mask patterns 3b and the gate insulating layer 7 are exposed between two word lines 15a. The gate insulating layer 7 on the recess regions 5 may be removed according to an exemplary embodiment of the present invention.

Referring to FIGS. 10A, 10B, 10C and 10D, an interlayer insulating layer 17 is formed on an upper surface of the semiconductor substrate 1. The interlayer insulating layer 17 covers the exposed mask patterns 3b and the word lines 15a, and fills the exposed recess regions 5. Bit lines 19 overlapping the buried impurity diffusion regions 11 are formed on the interlayer insulating layer 17. The bit lines 19 are electrically connected with the buried impurity diffusion regions 11.

Figure 10A:
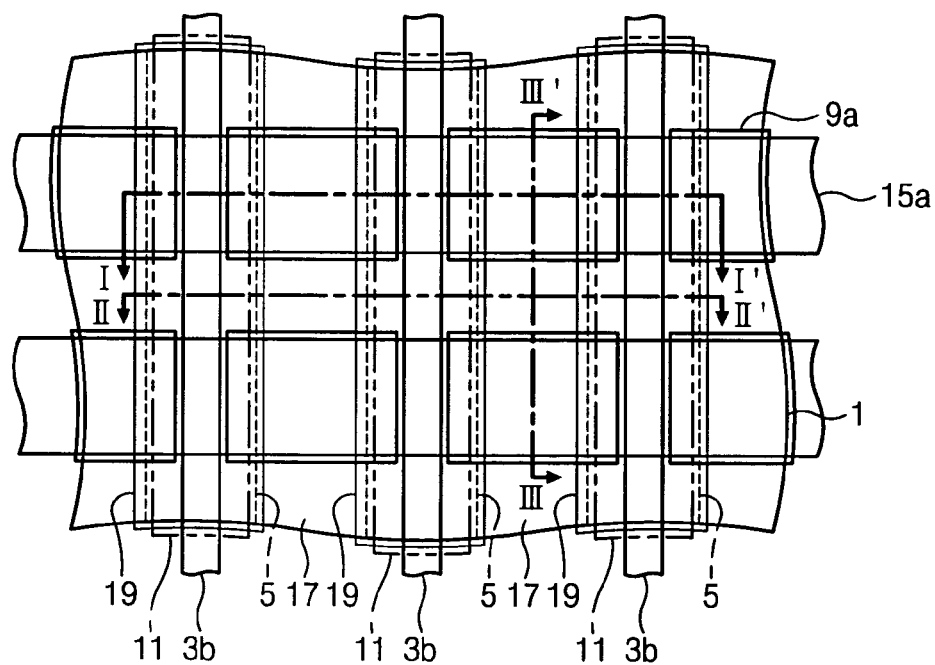
Figure 10B:
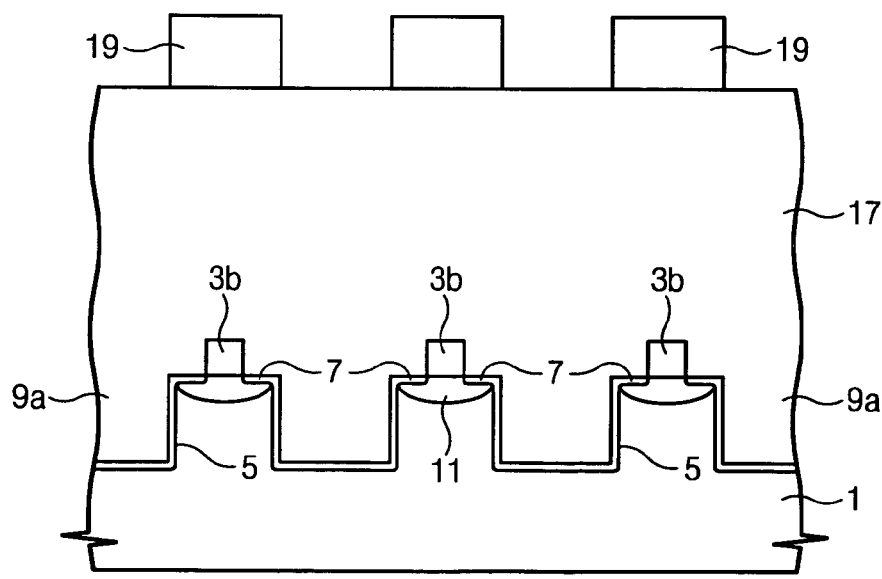
Figure 10C:
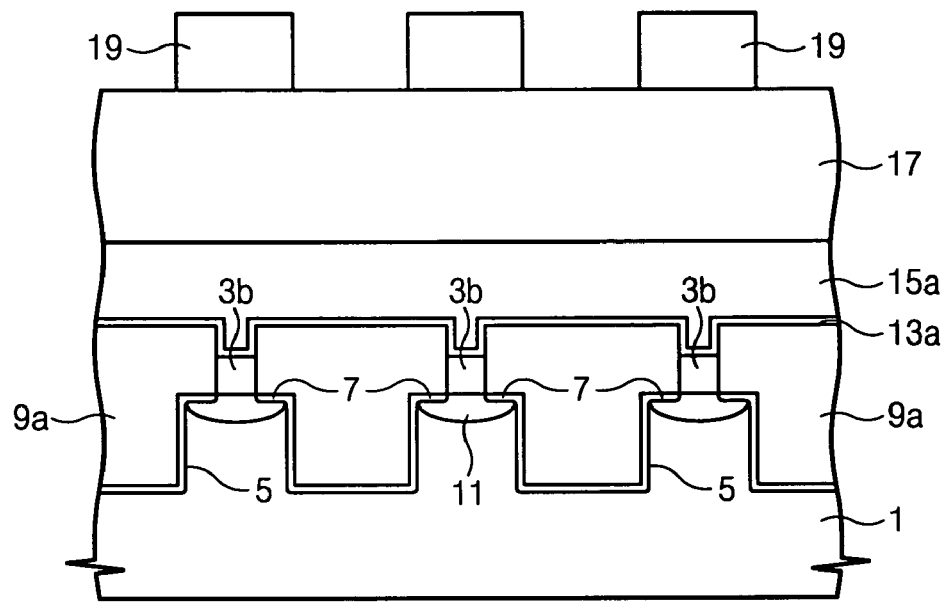
Figure 10D:
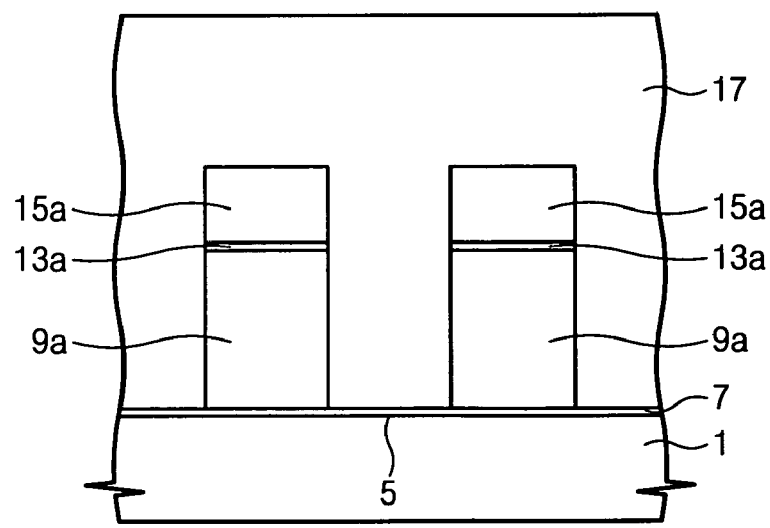
FIG. 10D is a cross-sectional view taken along the line III-III' of FIG. 10A.

Referring to FIG. 10B, the interlayer insulating layer 17 filling the recess regions 5 between two buried impurity diffusion regions 11 can be a device isolating layer. A distance between the two buried impurity diffusion regions 11 is long enough to prevent, for example, a punch through, or a leakage current.

According to an exemplary embodiment of the present invention, the recess region can be formed between two buried impurity diffusion regions on the semiconductor substrate, and a portion of the recess region can be filled with the interlayer insulating layers. Therefore, a distance between the two buried impurity diffusion regions substantially becomes longer, thereby preventing, for example, a punch through or a leakage current. According to an exemplary embodiment of the present invention, the floating gates can be self-aligned to the adjacent mask patterns, thereby preventing a misalignment and improving a process margin.

Although exemplary embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A method of forming a contactless nonvolatile memory device, the method comprising:
   preparing a semiconductor substrate including a cell array region;
   forming a plurality of mask patterns being parallel to each other on the semiconductor substrate in the cell array region;
   etching the semiconductor substrate using the plurality of mask patterns as an etch mask to form a plurality of recess regions;
   forming a gate insulating layer on sidewalls and bottoms of the plurality of recess regions;
   forming a floating gate layer on an upper surface of the semiconductor substrate to fill the plurality of recess regions;
   planarizing the floating gate layer to expose upper surfaces of the plurality of mask patterns and to respectively form floating gate patterns in the plurality recess regions;
   forming buried impurity diffusion regions in the semiconductor substrate under the plurality of mask patterns;
   forming an intergate dielectric layer;
   forming a control gate layer; and
   patterning the control gate layer, the intergate dielectric layer and the floating gate pattern to form a plurality of parallel word lines respectively crossing the plurality of mask patterns, floating gates between the plurality of parallel word lines and the recess regions, and an intergate dielectric pattern between the floating gates and the plurality of parallel word lines, and to expose the plurality of recess regions and the plurality of mask patterns between plurality of parallel word lines.

2. The method of claim 1, further comprising, after forming plurality of the recess regions, removing a portion of at least both sidewalls of the plurality of mask patterns to expose a portion of the semiconductor substrate between the plurality of recess regions,
   wherein the gate insulating layer is formed on the exposed semiconductor substrate, and the floating gate patterns fill the plurality of recess regions and contact the exposed semiconductor substrate having the gate insulating layer therebetween.

3. The method of claim 1, further comprising, after the forming of the floating gate patterns, removing a portion of upper portions of the plurality of mask patterns such that upper surfaces of the plurality of mask patterns are lower than upper surfaces of the floating gate patterns.

4. The method of claim 1, wherein the plurality of mask patterns comprise a material having an etch selectivity with respect to the gate insulating layer, the semiconductor substrate, and the floating gate patterns.

5. The method of claim 4, wherein the plurality of mask patterns comprise a silicon nitride layer.

6. The method of claim 1, wherein the semiconductor substrate is doped with first conductivity type impurities, and the buried impurity diffusion regions are doped with second conductivity type impurities.

7. The method of claim 1, further comprising, after forming the plurality of parallel word lines:
   forming an interlayer insulating layer on an upper surface of the semiconductor substrate to fill the plurality of recess regions exposed between the plurality of parallel word lines; and
   forming bit lines overlapping the buried impurity diffusion regions on the interlayer insulating layer.

* * * * *